US005747841A

United States Patent [19]

Ludikhuize

[11] Patent Number: 5,747,841
[45] Date of Patent: May 5, 1998

[54] CIRCUIT ARRANGEMENT, AND JUNCTION FIELD EFFECT TRANSISTOR SUITABLE FOR USE IN SUCH A CIRCUIT ARRANGEMENT

[75] Inventor: Adrianus W. Ludikhuize, Eindhoven, Netherlands

[73] Assignee: U.S. Philips Corporation, NY, N.Y.

[21] Appl. No.: 574,830

[22] Filed: Dec. 19, 1995

[30] Foreign Application Priority Data

Dec. 20, 1994 [EP] European Pat. Off. .............. 94203688

[51] Int. Cl.[6] .................................................. H01L 29/772
[52] U.S. Cl. .......................... 257/266; 257/263; 257/272
[58] Field of Search ...................................... 257/266, 256, 257/272, 263

[56] References Cited

U.S. PATENT DOCUMENTS

| 3,947,707 | 3/1976 | Shannon et al. | 307/311 |
| 4,187,513 | 2/1980 | Spellman | 357/1 |
| 5,008,725 | 4/1991 | Lidow et al. | 357/23.4 |

OTHER PUBLICATIONS

"Physics of Semiconductor Devices", by S.M. Sze, 2nd. ed., John Wiley & Sons, New York, pp. 351–357.

Primary Examiner—Tom Thomas
Assistant Examiner—David B. Hardy
Attorney, Agent, or Firm—Brian J. Wieghaus

[57] ABSTRACT

A circuit arrangement for comparatively high powers, for example, for gas discharge lamps is protected against high currents, which may be caused inter alia by inrush effects or transients, by a semiconductor current limiter element V. The current limiter element comprises a semiconductor body of substantially a given conductivity type, for example the n-type. The main electrodes are provided at the upper and the lower surface of the semiconductor body and comprise two metal electrodes which are connected to the semiconductor body via highly doped contact zones. The doping of the interposed region is such that current saturation occurs from a certain voltage upon a rise in voltage between the main electrodes. In a first embodiment, buried floating p-type zones are formed in the interposed region, so that the element is a junction field effect transistor with floating gate. In a second embodiment, the thickness and/or doping concentration of the intermediate region is so chosen that the current is limited owing to velocity saturation. Such a current limiter element is eminently suitable for use in systems with gas discharge lamps because it is resistant to very high voltages and a high dissipation, is capable of passing the current in two directions, and can in addition be manufactured in a very simple process, so that it is comparatively inexpensive.

13 Claims, 3 Drawing Sheets

CIRCUIT ARRANGEMENT, AND JUNCTION FIELD EFFECT TRANSISTOR SUITABLE FOR USE IN SUCH A CIRCUIT ARRANGEMENT

BACKGROUND OF THE INVENTION

The invention relates to a circuit arrangement for operating a load by means of a supply voltage, provided with input terminals for connection to poles of a supply voltage source, a circuit portion V for limiting an input current which passes through the input terminals during operation as a result of the supply voltage, which circuit portion comprises a semiconductor element with two main electrodes which is connected to junction points in the circuit arrangement such that the input current flows through the two main electrodes. The invention also relates to a junction field effect transistor suitable for use in such a circuit arrangement.

It is known to protect electric circuits against too high input currents by means of a current limiter. Such a limiter is necessary, for example, in appliances which comprise a large capacitor, whereby high peak currents may arise upon switching-on in the absence of a current limiter when the mains voltage happens to be exactly at its maximum during switching-on, and defects may arise in switches or fuses owing to the strong current. The problem may arise, for example, with the use of several gas discharge lamps (PL or TL) with electronic ballasts on a common switch. The simplest method of limiting the inrush current is the use of a series resistor in the circuit. Since the normal operational current must also pass through the series resistor, its resistance must remain limited to a comparatively low value, so that nevertheless relatively high peak currents may arise.

The book "Physics of Semiconductor Devices" by S. M. Sze, 2nd. ed., John Wiley & Sons, New York, describes current limiters which behave practically as resistors in a first voltage range up to a certain voltage, and as current sources beyond this voltage, where the current through the element practically does not rise any more upon a further rise in the voltage. An example given on p. 353 of this book and shown in FIG. 32 is a "saturated-velocity diode" which basically consists of a shallow n-type surface zone in a p-type Ge substrate. Highly doped n$^+$-type contact zones are provided on either side of this zone for passing on the current. The operation of this diode is based on velocity saturation in the shallow surface zone, where the velocity of the charge carriers, i.e. electrons in this case, does not rise any further with stronger electric fields beyond an electric field of a given value. This known current limiter is designed for currents in the mA range and for a voltage of at most a few tens of volts. This element, however, is not suitable for higher powers, where currents of the order of, for example, 1 A and voltages of a few hundreds of volts are used, as is the case with gas discharge lamps. A current limiter element is required for such applications which can withstand a high dissipation under normal operational conditions, which can withstand inrush currents where the dissipation can be very high during a short period, and which can withstand high voltages, for example of the order of 1 kV. In a number of cases, as in gas discharge lamps, the supply may comprise an a.c. voltage source and a rectifier bridge which converts the a.c. voltage into a d.c. voltage. A current limiter element for the protection of the rectifier bridge in such a circuit is desirable, placed in front of the rectifier bridge, which can thus limit the current in two directions.

SUMMARY OF THE INVENTION

The invention has for its object inter alia to provide a circuit arrangement of the kind described in the opening paragraph which can be used for high powers and high voltages. A further object of the invention is to provide such a circuit arrangement suitable for high powers in which a rectifier bridge is connected to an a.c. voltage source via a current limiter.

According to the invention, a circuit arrangement of the kind described in the opening paragraph is for this purpose characterized in that the semiconductor element comprises a semiconductor body of substantially a certain conductivity type, called first conductivity type hereinafter, wherein the main electrodes are provided at two mutually opposed surfaces and each comprise a zone adjoining the respective surface and having a higher doping concentration than an adjoining portion of the semiconductor body which is situated between the more highly doped zones and whose doping is chosen such that current saturation occurs when the voltage between the main electrodes rises further than a given voltage. In a current limiter element as described above, the current does not flow parallel to, but transverse to the main surfaces of the semiconductor body, the maximum current being directly proportional to the surface area of the main surfaces. The current limiter element may be designed in a comparatively simple manner such that the requirements mentioned above relating to the dissipated power (and thus the heat removal), breakdown voltage, and symmetry for a given, practical application are complied with, for example, for a ballast circuit for gas discharge lamps.

A first embodiment of a circuit arrangement according to the invention is characterized in that the semiconductor element forms a junction field effect transistor where the main electrodes form the source and drain electrodes of the transistor and where buried zones of the second conductivity type opposed to the first situated in the semiconductor body form an electrically floating gate electrode and define interposed portions of a channel. Since the gate electrode is floating, no control circuit is necessary for the current limiter element, so that the circuit remains simple. In addition, the element can be constructed symmetrically, so that the source and drain electrodes can be interchanged and the element can be placed both in front of and behind a rectifier bridge. Within a voltage range around 0 V the element behaves as a resistor with an on-resistance which is preferably as low as possible. From a certain voltage, the current does not or at least substantially not rise any further. The operation of the element is based on the fact that, for example in the case of a transistor with an n-type channel, the potential of the floating p-type gate electrode follows the potential of the n-type source, i.e. the electrode having the lowest potential, so that the I–V characteristic at gate voltage 0 V is followed and the current becomes saturated when the voltage at the drain is greater than the pinch-off voltage. The value of the saturation current may be chosen in various ways, for example, through the width of the channels between the buried zones which form the gate electrode and/or the size of the transistor. A preferred embodiment is characterized in that the buried zones have at least substantially the shape of regular hexagons which are grouped in honeycomb fashion and leave interposed portions of the first conductivity type free, which portions form the transistor channel. It was found that such a design leads to a low on-resistance and a high breakdown voltage.

During operation, a voltage pulse on the drain electrode may block the channel because the pn junction of the buried gate electrode is reverse-biased, so that the transistor temporarily passes no current. This current blocking is of a temporary nature only owing to leakage currents by which the gate electrode is discharged again, and accordingly it is no disadvantage for a certain number of applications. In other applications, however, where a more continuous current passage is necessary or desirable, it is advantageous to increase the leakage currents in order to shorten the discharge time of the pn junctions. A further preferred embodiment is accordingly characterized in that the semiconductor body comprises a region which is provided with generating centres for minority carriers and which is situated at a distance from the buried zones of the second conductivity type which is at most equal to the diffusion length in the more weakly doped portion of the first conductivity type. The generating centres may be obtained by means of impurities such as Au or Pt whereby, as is known, forbidden band states are formed which increase the leakage currents. Since such generating centres at the same time act as recombination centres or "killers", the resistivity of the semiconductor material, and thus the on-resistance of the transistor may increase somewhat owing to the presence of Au or Pt. This can obviously be compensated for, if so desired, in that, for example, the size of the transistor is adapted.

A second type of circuit arrangement according to the invention is characterized in that said adjoining portion of the first conductivity type situated between the more highly doped zones has a thickness and a doping in which current saturation occurs in the current-voltage characteristic as a result of velocity saturation of the mobile charge carriers during operation at sufficiently high voltages. In a specific embodiment, the current limiter element has an $n^+$-$n^-$-$n^+$ configuration which contains not a single pn junction, and which is thus particularly simple to manufacture.

BRIEF DESCRIPTION OF THE DRAWING

The invention will be explained in more detail with reference to a few embodiments and the accompanying diagrammatic drawing, in which.

Figure 1:
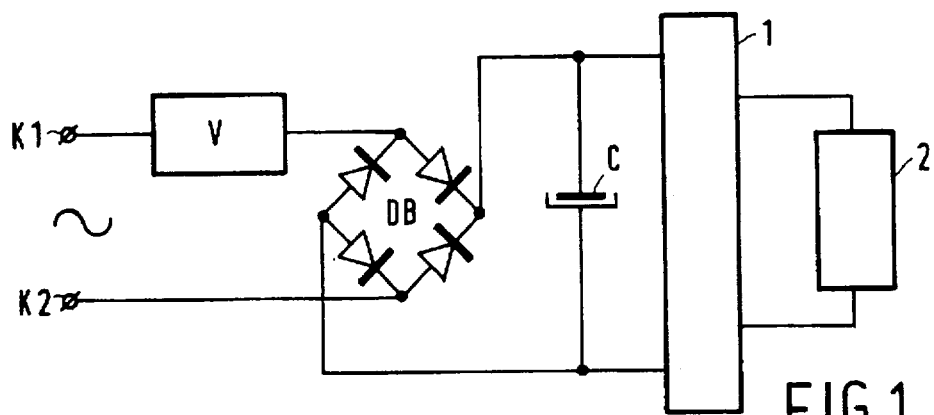
FIG. 1 shows a circuit arrangement according to the invention.
Figure 5:
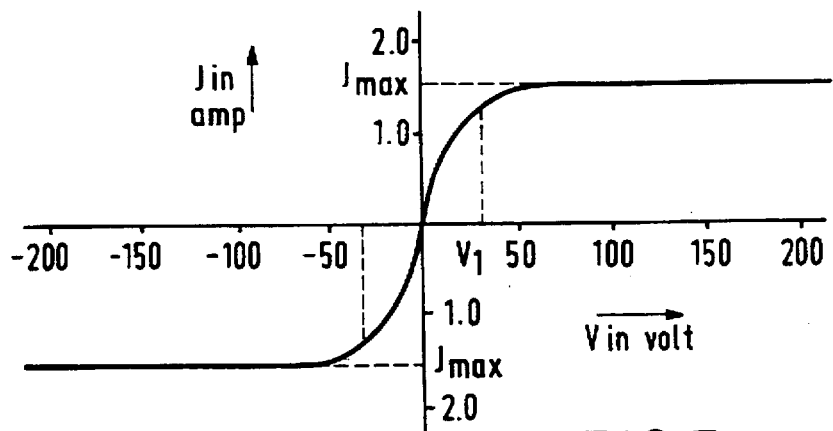
Figure 6:
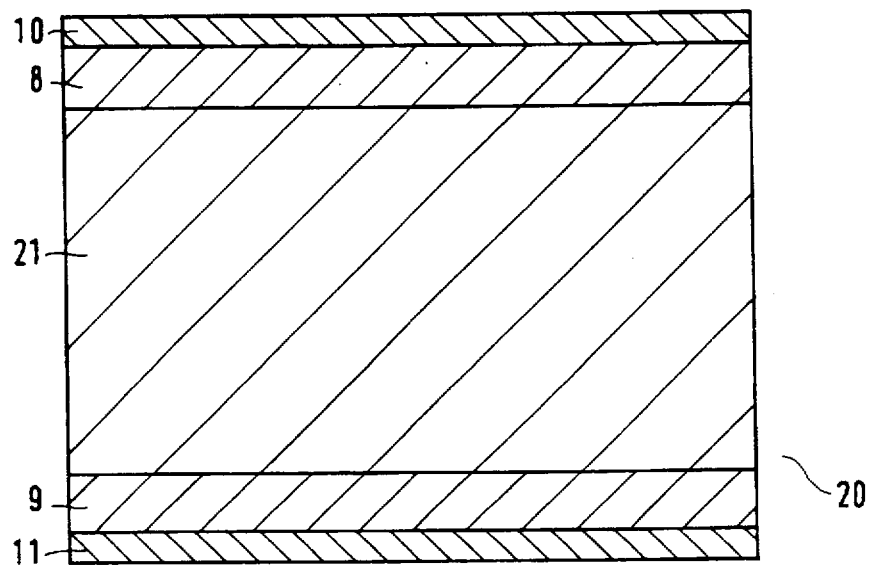
Figure 7:
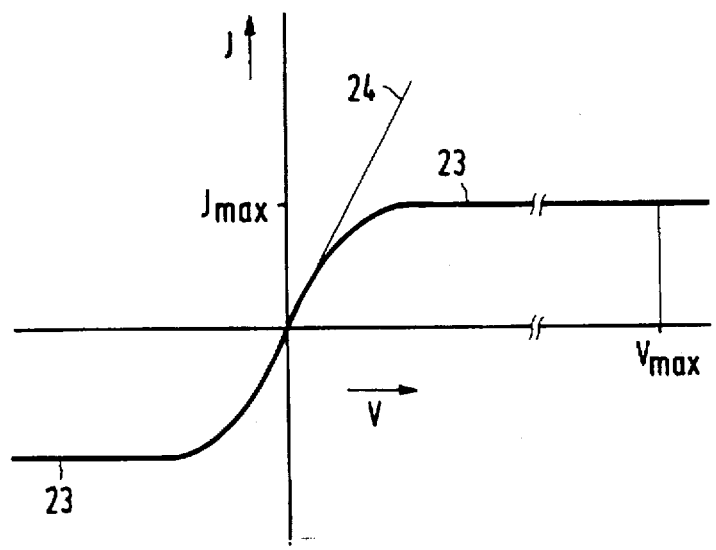
Figure 8:
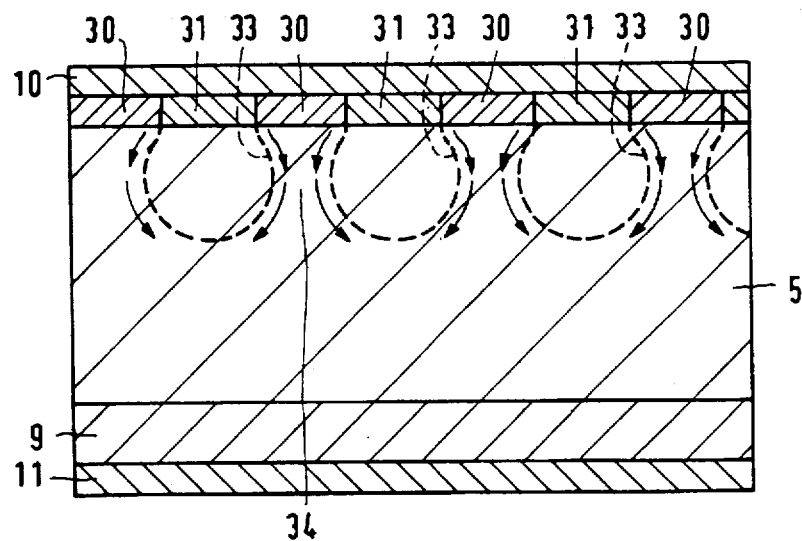

FIG; 4 shows the current I as a function of the applied voltage V;

FIG. 5 shows part of the doping mask used in the manufacture of the current limiter element;

FIG. 6 is a cross-section of a different current limiter element suitable for use in the circuit arrangement of FIG. 1;

FIG. 7 shows the current I as a function of the voltage V in the current limiter element of FIG. 6; and FIG. 8 is a cross-section of a further current limiter element suitable for use in the circuit of FIG. 1.

DETAILED DESCRIPTION OF THE PREFERRED EMBODIMENTS

FIG. 1 shows by way of example a circuit arrangement suitable for operation on an a.c. voltage supply of changing polarity which is fully rectified by means of a diode bridge DB. The supply is formed, for example, by the power mains. The circuit can be connected to the voltage supply with input terminals K1 and K2. An element V is present between input terminal K1 and diode bridge DB, which element serves to limit the current to a predetermined value. The other input terminal, K2, is connected to the other input of the diode bridge. The outputs of the diode bridge are connected to a load, for example a circuit for operating gas discharge lamps, with a buffer capacitance C and a diagrammatically depicted dc-ac converter 1 which forms a supply for one or several gas discharge lamps 2 which are also diagrammatically shown. The operation of the circuit is as follows. When the input terminals K1 and K2 are connected to the supply voltage source which delivers a supply voltage of alternating polarity, the current supplied by the source passes through the element V. The voltage across the element V can reach a comparatively high value especially during switching-on of the circuit arrangement when the (large) buffer capacitor C is still empty or substantially empty, while the mains voltage happens to be exactly at its maximum. A very strong current would pass through the circuit (inrush current) under these circumstances in the absence of the current limiter element. The voltage between the input terminals may also reach a high value owing to transients also during stationary operation of the load after switching-on. The element V limits the current in the circuit to a predetermined value and thus prevents excessive dissipation and even possible damage to the circuit. The element V does not require a control circuit, so that the circuit arrangement remains simple. Owing to the position of the current limiter in the circuit, i.e. between the supply and rectifier bridge DB, the current limiter element must function in two mutually opposed directions.

Figure 2:
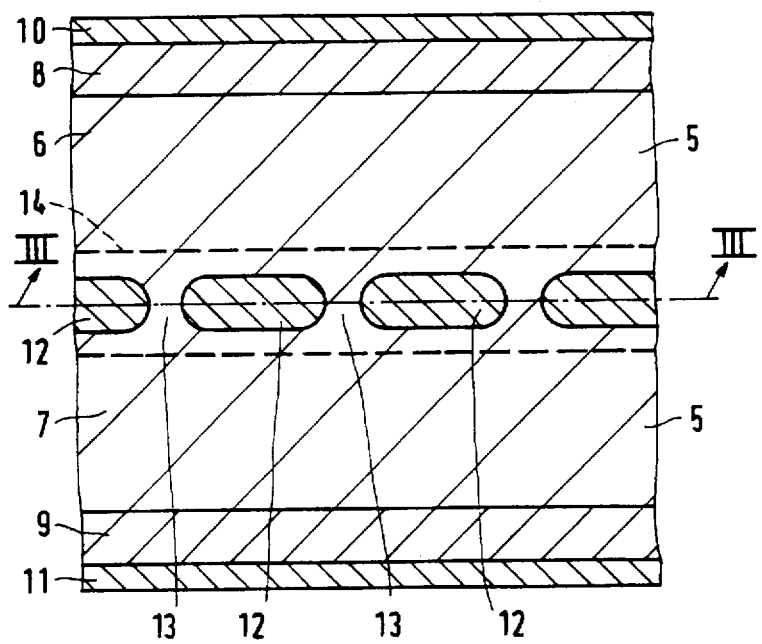
FIG. 2 shows the current limiter element used in this circuit in cross-section.
Figure 3:
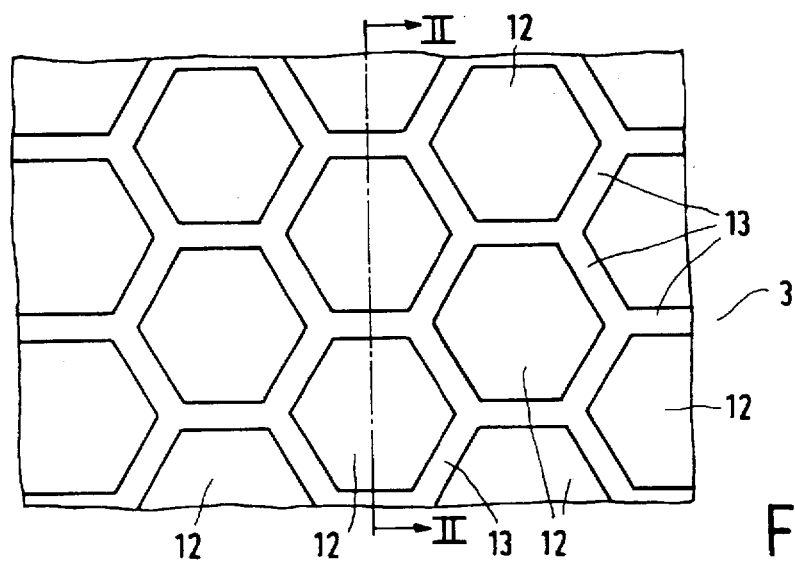
FIG. 3 is a cross-section of this current limiter element taken on the line III—III.

In the present example, the current limiter element V comprises a junction field effect transistor 3 which is shown in FIG. 2 in sectional view parallel to the main current direction between the main electrodes. The transistor is formed in a semiconductor body 5 which is preferably made of silicon, but which may alternatively be made of another suitable semiconductor material instead of silicon. The semiconductor body is substantially of the n-type, so that conduction in the device takes place by means of electrons. Obviously, a p-channel type transistor could also be used in principle, but since an n-channel type transistor has a lower on-resistance, the latter is usually preferred over a p-channel transistor. The semiconductor body 5 is mainly formed by two comparatively high-ohmic n-type regions 6 and 7 with a doping concentration of between, for example, $1.5 \times 10^{14}$ and $5 \times 10^{14}$ at per cm$^3$. The thickness of the regions 6 and 7 is approximately 125 μm. Highly doped n-type contact zones 8 and 9 are provided to a thickness of approximately 35 μm at the upper surface and lower surface of the semiconductor body and are connected to metal electrodes 10 and 11. The zones 8 and 9 and the electrodes 10 and 11 extend over the entire or at least substantially the entire surface area of the semiconductor body 5, forming the source and drain of the junction field effect transistor. The gate electrode 12 of the transistor is provided in the form of highly doped buried p-type zones with a thickness of between 30 and 50 μm at the interface between the high-ohmic regions 6 and 7. Between the zones 12, n-type regions 13 are left free, having a width of between, for example, 5 and 15 μm, forming the channels of the transistor. To obtain a channel surface area per unit surface area of the semiconductor body which is as large as possible, and thus an on-resistance which is as low as possible, the gate electrode 12 is preferably provided in a pattern of regular polygons. A suitable shape which may be used for the zones 12 in this case is a square. In the present example, however, a regular hexagon was chosen because this shape is somewhat more favourable in regard to the breakdown voltage owing to the less acute angles. This is depicted in FIG. 3, where the device is shown in sectional view parallel to the main surfaces at the area of the interface between the regions 6 and 7.

As was noted above, the electrically floating zones 12 may be electrically charged during operation. Since the zones can only be discharged through generation of charge carriers in the semiconductor body, it may be advantageous to dope a region 14 in the vicinity of the zones 12, i.e. within a distance equal to a diffusion length of the zones 12, with Au or Pt atoms which cause forbidden band states in the energy diagram and thus an increase in the leakage current. The region 14 is shown in broken lines in FIG. 2.

The transistor may be manufactured in a manner which is known per se. The manufacture may start from a silicon substrate which forms the high-ohmic region 7 in the finished transistor and which is provided at one side with p-type zones from which the buried zones 12 are obtained in a later stage. Then the high-ohmic region 6 is provided at the same side, either by epitaxy or by wafer bonding. The highly doped n-type contact zones 9 and 11 can then be provided on either side of the structure thus obtained, for example through diffusion. Simultaneously, the p-type impurity provided at the interface between the regions 6 and 7 diffuses further into the silicon, whereby the p-type zones 12 are formed. After that, the upper surface and the lower surface may be provided with contacts 10 and 11 in known manner.

Figure 4:
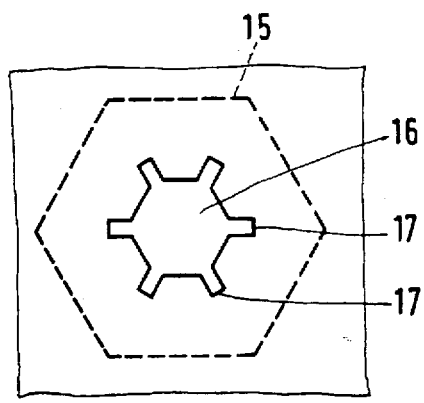

In the final diffusion step mentioned above, exhaustion of the dopant at the corners may occur during diffusion when a mask with hexagonal openings is used for the doping. As a result, the corners of the zones 12 may be rounded off, so that the channel passage becomes greater locally and the current is less satisfactorily limited. To prevent this, a doping mask may be used for a hexagon as is diagrammatically depicted in FIG. 4. The hexagon 15 shown in broken lines represents the dimension of a zone 12 to be eventually achieved. The mask opening 16 corresponding to this zone 12 basically consists of a hexagon identical to the hexagon 15 whose corners are provided with extensions 17 which provide an additional p-type doping in the corners.

The transistor may finally be enveloped in a suitable package for the purpose of heat removal.

FIG. 5 shows the current I (amps) as a function of the voltage V (volts) across the current limiter element. The potential of the floating gate electrode 12 follows the potential of the electrode 10 or 11, whichever of these electrodes has the lower potential. This electrode forms the source of the transistor, so that the current through the transistor is determined by the transistor characteristic for gate voltage $V_g=0$ V. In a region around V =0 V, the transistor behaves as a resistor with a resistance $R_{on}$ (resistance at $V_{ds}=0$ V) which is preferably as low as possible. In the example described above, an $R_{on}$ value of, for example, 12 Ohms for a surface area of 4 mm$^2$ is found to be readily achievable. The voltage loss across the current limiter element V can thus be kept at an acceptable low level under normal circumstances. Given a voltage greater than $V_1$ (absolute value), the transistor practically behaves as a current source, in which the current does not or substantially not rise any further upon a further rise in voltage. The current in the circuit is effectively limited to the value $I_{max}$, which value is adjustable by means of the transistor surface area, in the case of supply voltage peaks. It is noted that the current is not entirely voltage-independent from the voltage $V_1$ upwards, but rises slightly with the voltage. This rise, however, is sufficiently small for most applications and, surprisingly, much smaller than in known structures in which the gate electrode 12 is provided between the source zones at the surface of the semiconductor body.

The transistor is of symmetrical construction and accordingly limits the current in two directions, so that it can be placed in front of the rectifier bridge DB. The transistor may be so manufactured, through a suitable choice of dimensions and doping concentrations, that it is resistant to very high voltages without breakdown. A breakdown voltage above 700 V can be readily achieved in the present example. It was found in experiments that the transistor is capable of dealing with high power levels satisfactorily, both stationary and peak powers, as is required inter alia in lighting systems with gas discharge lamps.

FIG. 6 is a cross-section of an alternative semiconductor element which can be used as a current limiter element for high powers, and which may accordingly be used instead of the junction field effect transistor in the circuit of FIG. 1. Corresponding parts will be given the same reference numerals as in the preceding embodiment as much as possible in the description. The semiconductor device of FIG. 6 comprises a semiconductor body 20 which is now entirely of n-type silicon and is provided at the upper side and at the lower side with two contacts 10 and 11 by which the element can be connected to the supply and to the diode bridge DB (FIG. 1), respectively. To obtain good ohmic contacts, the semiconductor body 20 is also provided on both sides with highly doped n-type contact zones 8 and 9. The zones 8 and 9 are mutually separated by a comparatively weakly doped region 21 which is entirely of the n-type. The thickness of the region 21 is chosen such that current limitation takes place in the body 20 at the voltages which may arise in a certain application owing to saturation in the drift velocity of the electrons in the region 21.

FIG. 7 shows the current-voltage characteristic of such a current limiter element. It is noted first of all that the characteristic is symmetrical relative to V=0 V, which means that the element operates independently of the direction of current and may accordingly be placed in front of the diode bridge. Furthermore, the element shows a resistance behaviour in a voltage region around V=0 V according to which the current rises strongly with a rise in voltage. Since the mobility of the charge carriers (electrons) gradually decreases with an increasing electric field, the drift velocity of the electrons, and thus the current I between the electrodes 10 and 11, becomes saturated with a rising voltage. The maximum current value is indicated with $I_{max}$ in FIG. 1. The voltage between the electrodes 10 and 11 can continue to rise up to the breakdown voltage $V_{max}$.

A few characteristic values, besides $I_{max}$ and $V_{max}$, are the resistance values $R_{on}$ for a low electric field, represented in FIG. 7 by the slope of the tangent line 24. It holds for these values by approximation:

(1) $I_{max}=A.q.N.v_{lim}$ (A=surface area; N=doping of region 21; q=el.charge;

$v_{lim}$=drift velocity of electrons for strong el. field)

(2) $R_{on}=L/(\mu.q.N.A)$ ($\mu$=electron mobility;

L=thickness of region 21)

(3) $V_{max}=E_c.L$ ($E_c$=critical el. field for breakdown)

The quantity L depends on the desired value for the breakdown voltage, where it should be noted that it holds for strong currents: $L=2V_{max/Ec}$. The product $R_{on}.I_{max}$ can be regarded as a characteristic quantity. This product is $V_{max}$ for a linear resistor, so it is equal to 300 V in the case of a maximum mains voltage of 300 V. When a non-linear element is used, this quantity may be much lower, preferably as low as possible. It can be derived from the above equations that the following is true for this product:

(4) $R_{on} \cdot I_{max} = v_{lim} \cdot L / \mu$

For n-type silicon, $v_{lim} = 10^7$ cm/s, and $E_c = 20 \times 10^4$ V/cm. The mobility is independent of temperature and lies (for a low electric field) between 1000 and 1400 cm²/V.s. The dimensioning may be based, for example, on a given value for $V_{max}$. If this value is to be, for example, 700 V, the thickness of the region 21 must be approximately 70 μm. The product $R_{on} \cdot I_{max}$ is then approximately 50 V. If $R_{on}$ is approximately 12 Ohms in that case, a current of approximately 4 A can be passed. The on-resistance $R_{on}$ may be adjusted via adjustment of the surface area A and/or the doping of the n-type region 21. For $R_{on}=12$ Ohms and $L=70$ μm, the surface area A becomes approximately 3 mm² for a doping concentration $N=10^{14}$ at per cm³.

The element described here forms part of a robust bulk technology, which is of major importance for heat dissipation, heat transients, and high voltages. The element is in addition inexpensive to manufacture, requires no control mechanism, and may be placed in front of the rectifier bridge, so that the latter may also be inexpensive.

FIG. 8 is a cross-section of a vertical junction field effect transistor which may also be used as a current limiter in power circuits. The element again comprises a weakly doped n-type silicon body 5 which is provided with a highly doped drain zone 9 and a drain contact 11 at the lower side. The source zone comprises a number of highly doped n-type surface zones 30. The gate electrode is not formed by buried zones, as in the embodiment of FIG. 2, but comprises a number of highly doped p-type surface zones 31 provided between the source zones 30. The gate electrode 31 is short-circuited with the source zone 30 by the source electrode 10. During operation, depletion regions 33 shown in broken lines in the drawing extend into the high-ohmic region 5, defining channels 34 through which the current, indicated with the arrows, runs to the drain zone. This current limiter element has substantially all the advantages of the current limiter elements described earlier, but because of its asymmetrical structure it must be connected behind the rectifier bridge DB. On the other hand, however, the gate electrode 31 is not electrically floating, as is the buried gate in FIG. 2, so that it can be avoided that the gate electrode is electrically charged, so that also the breakdown risk becomes smaller.

It will be evident that the invention is not limited to the embodiments given here, but that many more variations are possible to those skilled in the art within the scope of the invention. Thus a semiconductor body of Ge instead of Si may be used, in particular with the use of a current limiter element based on velocity saturation because of the higher mobility μ of the charge carriers and the lower drift velocity $v_{lim}$ in Ge. Si, however, has the advantage that the manufacture of the element is simpler.

The conductivity types may be reversed in the embodiments described.

I claim:

1. A circuit arrangement for operating a load by means of a supply voltage, provided with input terminals for connection to poles of a supply voltage source, a circuit portion for limiting an input current which passes through the input terminals during operation as a result of the supply voltage, which circuit portion comprises a semiconductor element with two main electrodes which is connected to junction points in the circuit arrangement such that the input current flows through the two main electrodes, characterized in that the semiconductor element comprises:

a semiconductor body of substantially a first conductivity type wherein the main electrodes are provided at two mutually opposed surfaces of the semiconductor body and each comprise a zone adjoining the respective surface and having a higher doping concentration than an adjoining portion of the semiconductor body which is situated between the more highly doped zones, the doping of the portion between the highly doped zones being chosen such that current saturation occurs when the voltage between the main electrodes rises further than a given voltage;

the semiconductor body further incudes buried zones of the second conductivity type opposed to said first conductivity type, the buried zones being situated in the semiconductor body in said portion between said zones of higher doping concentration, forming an electrically floating gate electrode and defining interposed portions of a channel, the main electrodes forming the source and drain electrodes of the transistor; and the semiconductor body further comprises a region which is provided with generating centres for minority carriers and which is situated at a distance from the buried zones of the second conductivity type which is at most equal to the diffusion length in the more weakly doped portion of the first conductivity type.

2. A circuit arrangement as claimed in claim 1, characterized in that the buried zones have at least substantially the shape of regular hexagons which are grouped in honeycomb fashion and leave interposed portions of the first conductivity type free, which portions form the transistor channel.

3. A current limiting device, comprising:

a semiconductor body of a first conductivity type, said body having opposing surfaces and a pair of first zones, each adjoining a respective said surface, and a second zone between said first zones, said first zones each having a higher doping concentration than said second zone;

a source and a drain electrode each at a respective said surface of said semiconductor body;

said semiconductor body further including a plurality of floating gate electrodes comprised by buried zones of a second conductivity type opposite the first conductivity type, said plurality of buried zones being interspersed within said second zone and defining a plurality of channels between each of said buried zones, and a region surrounding said plurality of buried zones which region includes generating centers for minority carriers for increasing the leakage current from said buried zones, said region extending a distance from said buried zones which distance is at most equal to the diffusion length of the second zone.

4. A current limiting device according to claim 3, wherein said buried zones have substantially the shape of regular hexagons in planes parallel to said opposing surfaces and are arranged in honeycomb fashion.

5. A current limiting device according to claim 3, wherein the doping concentrations and the dimensions of said silicon body are selected for passing currents of greater than about 1 A.

6. A symmetrical current limiting device consisting essentially of:

a semiconductor body of a first conductivity type, said body having opposing surfaces and a pair of first zones, each adjoining a respective said surface, and a second zone between said first zones, said first zones each having a higher doping concentration than said second zone, said body and each of said zones being free of regions of a second conductivity type opposite to the first conductivity type; and a pair of electrodes each at a respective said surface of said semiconductor body and consisting of a layer of conductive material at each said surface;

said second zone having a doping concentration selected such that current saturation between said electrodes occurs when the voltage between said electrodes exceeds a predetermined voltage, said current saturation being substantially the same regardless of the polarity of a voltage of the same magnitude applied across said electrodes.

7. A current limiting device according to claim 6, wherein the doping concentrations and the dimensions of said silicon body are selected for passing currents of greater than about 1 A.

8. A current limiting device according to claim 6, wherein said layer of conductive material extends over substantially the entirety of each of said opposing surfaces of said semiconductor body.

9. A symmetrical current limiting device, comprising:

a semiconductor body of a first conductivity type, said body having opposing surfaces and a pair of first zones, each adjoining a respective said surface, and a second zone between said first zones, said first zones each having a higher doping concentration than said second zone, said body and each of said zones being free of regions of a second conductivity type opposite to the first conductivity type; and a pair of main electrodes each at a respective said surface of said semiconductor body and consisting of a layer of conductive material at each said surface extending over substantially the entirety of each of said opposing surfaces;

said second zone having a doping concentration selected such that current saturation between said electrodes occurs when the voltage between said electrodes exceeds a predetermined voltage, said current saturation being substantially the same regardless of the polarity of the voltage applied across said main electrodes; and said device being free of control electrodes at which an electric potential is applied to control the current between said main electrodes.

10. A current limiting device according to claim 9, wherein the doping concentrations and the dimensions of said silicon body are selected for passing currents of greater than about 1 A.

11. A current limiting device according to claim 10, wherein said layer of conductive material extends over substantially the entirety of each of said opposing surfaces of said semiconductor body.

12. A current limiting device, comprising:

a semiconductor body of a first conductivity type, said body having opposing surfaces and a pair of first zones, each adjoining a respective said surface, and a second zone between said first zones, said first zones each having a higher doping concentration than said second zone; and a pair of main electrodes each at a respective said surface of said semiconductor body and consisting of a layer of conductive material at each said surface extending over substantially the entirety of each of said opposing surfaces;

one of said zones of said first pair of zones of the higher doping concentration of the first conductivity type further includes a plurality of regular shaped regions regularly disposed therein of a second, opposite conductivity type, said regular shaped regions forming channels therebetween in said one zone of the first conductivity type through which channels current runs from the adjacent main electrode to the other main electrode, said regular shaped regions of the second conductivity type being electrically in contact with and short-circuited by said adjacent main electrode, and said device being free of control electrodes at which an electric potential is applied to control the current between said main electrodes.

13. A symmetric current limiting device, comprising:

a semiconductor body of a first conductivity type, said body having opposing surfaces and a pair of first zones, each adjoining a respective said surface, and a second zone between said first zones, said first zones each having a higher doping concentration than said second zone;

a pair of main electrode each at a respective said surface of said semiconductor body;

said semiconductor body further including a plurality of floating gate electrodes comprised by buried zones of a second conductivity type opposite the first conductivity type, said plurality of buried zones being interspersed within said second zone and defining a plurality of channels between each of said buried zones, said pair of first zones each having a thickness of about 35 microns, said second zone having a thickness of greater than about 280 microns, said buried zones having a thickness of between about 30 and about 50 microns, said channels between said buried zones being between about 5 and 15 microns, and said device having a breakdown voltage of at least about 700 V, said device being free of control electrodes at which an electric potential is applied to control the current between said main electrodes, and said device having a current saturation which is substantially the same regardless of the polarity of a voltage of the same magnitude applied across said main electrodes.

* * * * *